(12) United States Patent
Nakayama et al.

(10) Patent No.: US 9,960,071 B2
(45) Date of Patent: May 1, 2018

(54) POLISHING APPARATUS AND SEMICONDUCTOR MANUFACTURING METHOD

(71) Applicant: Toshiba Memory Corporation, Minato-ku (JP)

(72) Inventors: Takayuki Nakayama, Yokkaichi (JP); Masayoshi Adachi, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days. days.

(21) Appl. No.: 15/008,570

(22) Filed: Jan. 28, 2016

(65) Prior Publication Data

US 2017/0025283 A1 Jan. 26, 2017

(30) Foreign Application Priority Data

Jul. 21, 2015 (JP) .................. 2015-144298

(51) Int. Cl.
| | |
|---|---|
| H01L 21/67 | (2006.01) |
| H01L 21/687 | (2006.01) |
| B24B 37/24 | (2012.01) |
| H01L 21/3105 | (2006.01) |
| B24B 37/32 | (2012.01) |

(52) U.S. Cl.
CPC ........ H01L 21/68735 (2013.01); B24B 37/32 (2013.01); H01L 21/31053 (2013.01); H01L 21/67075 (2013.01); H01L 21/67092 (2013.01)

(58) Field of Classification Search
CPC ............... B24B 37/32; H01L 21/30625; H01L 21/67075; H01L 21/67092
See application file for complete search history.

(56) References Cited

U.S. PATENT DOCUMENTS

| 6,712,672 B1* | 3/2004 | Joo ........................ B24B 37/32 451/285 |
| 7,198,548 B1* | 4/2007 | Chen .................... B24B 41/005 451/11 |
| 2012/0214383 A1* | 8/2012 | Tsai ....................... B24B 37/32 451/28 |
| 2015/0183082 A1* | 7/2015 | Fukushima ............. B24B 37/32 451/59 |

FOREIGN PATENT DOCUMENTS

| JP | 2008-302464 | 12/2008 |
| JP | 2008-307674 | 12/2008 |
| JP | 2011-83836 | 4/2011 |

* cited by examiner

*Primary Examiner* — Karla A Moore
*Assistant Examiner* — Margaret D Klunk
(74) *Attorney, Agent, or Firm* — Oblon, McClelland, Maier & Neustadt, L.L.P.

(57) ABSTRACT

A polishing apparatus according to an embodiment includes a first polishing part, a second polishing part, and an annular part. The second polishing part includes a mounting surface for a semiconductor substrate, and rubs the semiconductor substrate mounted on the mounting surface while pressing the semiconductor substrate against the first polishing part. The annular part includes a support part provided in the second polishing part, and a plurality of convex portions that project from the support part toward the first polishing part, are arranged in a circumferential direction around the mounting surface while being supported by the support part, and are movable in a radial direction of the semiconductor substrate.

7 Claims, 16 Drawing Sheets

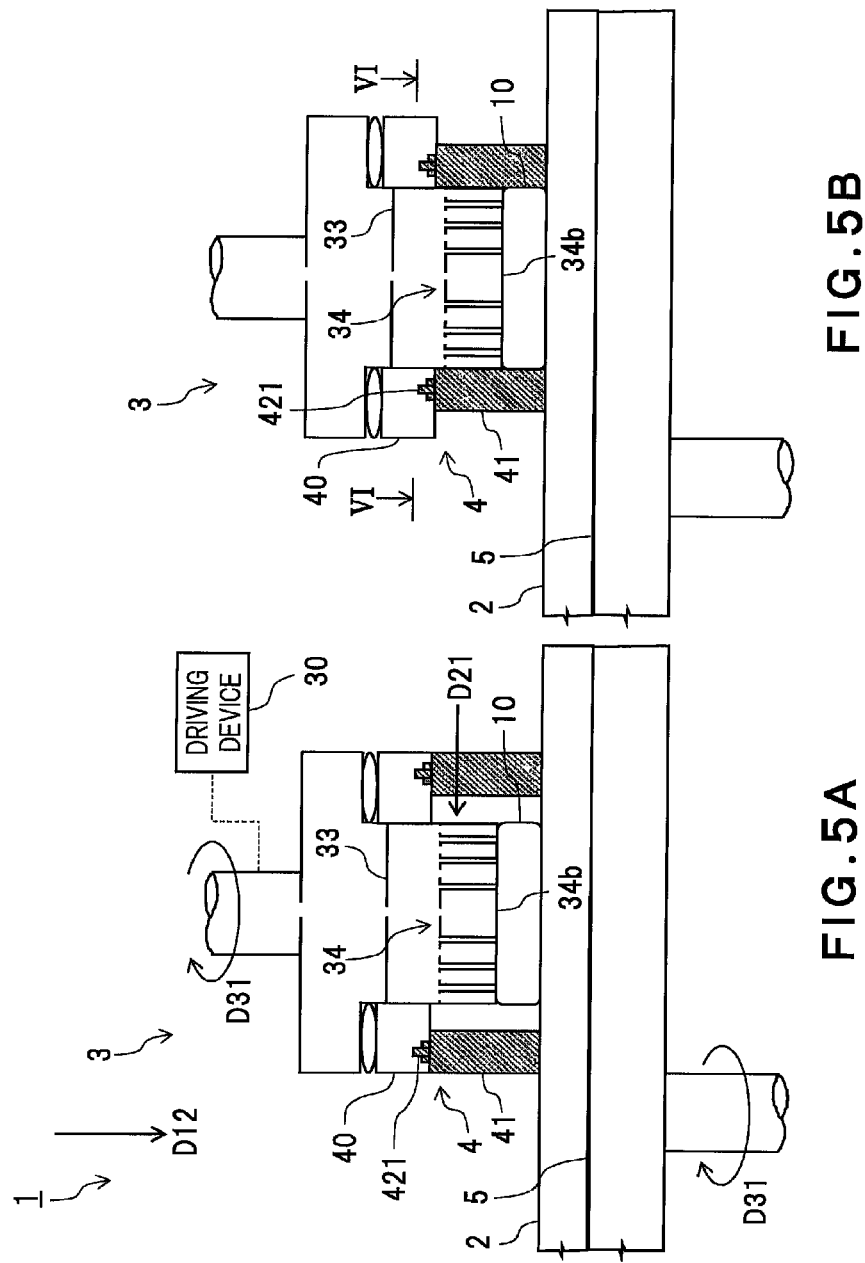

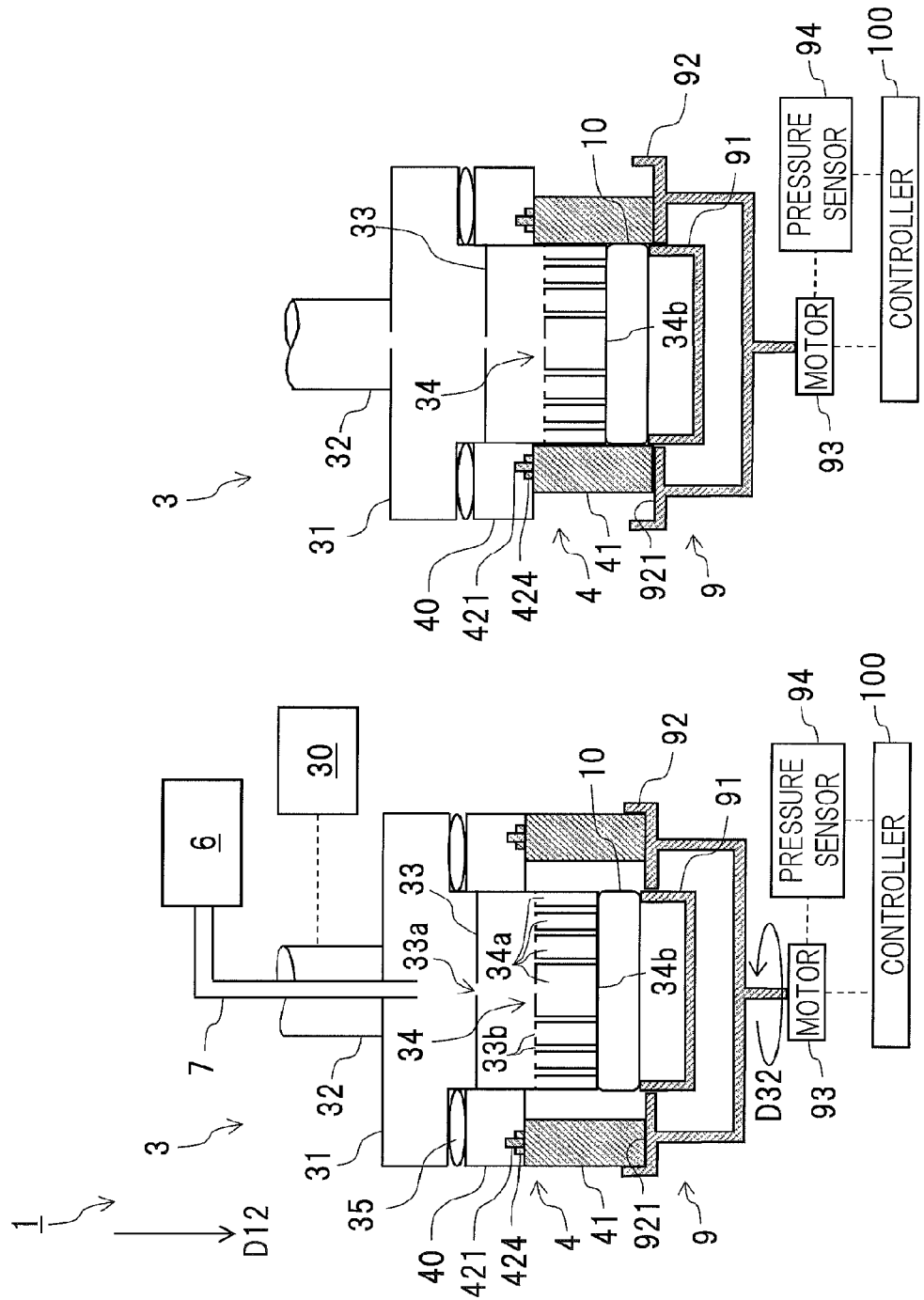

POLISHING APPARATUS AND SEMICONDUCTOR MANUFACTURING METHOD

CROSS REFERENCE TO RELATED APPLICATIONS

This application is based upon and claims the benefit of priority from the prior Japanese Patent Application No. 2015-144298, filed on Jul. 21, 2015, the entire contents of which are incorporated herein by reference.

FIELD

Embodiments relate to a polishing apparatus and a semiconductor manufacturing method.

BACKGROUND

In a semiconductor manufacturing process, CMP (Chemical Mechanical Polishing) is performed with a polishing apparatus to planarize a surface of a wafer. In CMP, the polishing apparatus polishes the wafer with a polishing head while pressing the wafer against a polishing pad. The polishing apparatus is provided with a retainer ring that surrounds the wafer in order to suppress deviation of the wafer with respect to the polishing head and to prevent the wafer from coming out.

In a conventional polishing apparatus, however, a radial gap between the retainer ring and the wafer generates rebound (rise) of the polishing pad in the radial gap. The generated rebound causes overpolishing in an outer peripheral edge portion of the wafer.

Further, while the polishing pad and the polishing head are rotated in the same direction in CMP, conventionally, polishing proceeds in a state where the wafer is shifted toward a downstream side in a rotation direction of the polishing pad. This increases variation in a polishing amount in a circumferential direction of the wafer.

BRIEF DESCRIPTION OF THE DRAWINGS

FIG. 5A is a cross-sectional view showing the semiconductor manufacturing method according to the first embodiment, and FIG. 5B is a cross-sectional view showing the semiconductor manufacturing method following that shown in FIG. 5A;

FIG. 10A is a cross-sectional view showing the semiconductor manufacturing method according to the first modification of the first embodiment, and FIG. 10B is a cross-sectional view showing the semiconductor manufacturing method following that shown in FIG. 10A;

DETAILED DESCRIPTION

A polishing apparatus according to an embodiment includes a first polishing part, a second polishing part, and an annular part. The second polishing part includes a mounting surface for a semiconductor substrate, and rubs the semiconductor substrate mounted on the mounting surface while pressing the semiconductor substrate against the first polishing part. The annular part includes a support part provided in the second polishing part, and a plurality of convex portions that project from the support part toward the first polishing part, are arranged in a circumferential direction around the mounting surfaces while being supported by the support part, and are movable in a radial direction of the semiconductor substrate.

Embodiments will now be explained with reference to the accompanying drawings. The present invention is not limited to the embodiments.

First Embodiment

Figure 1:
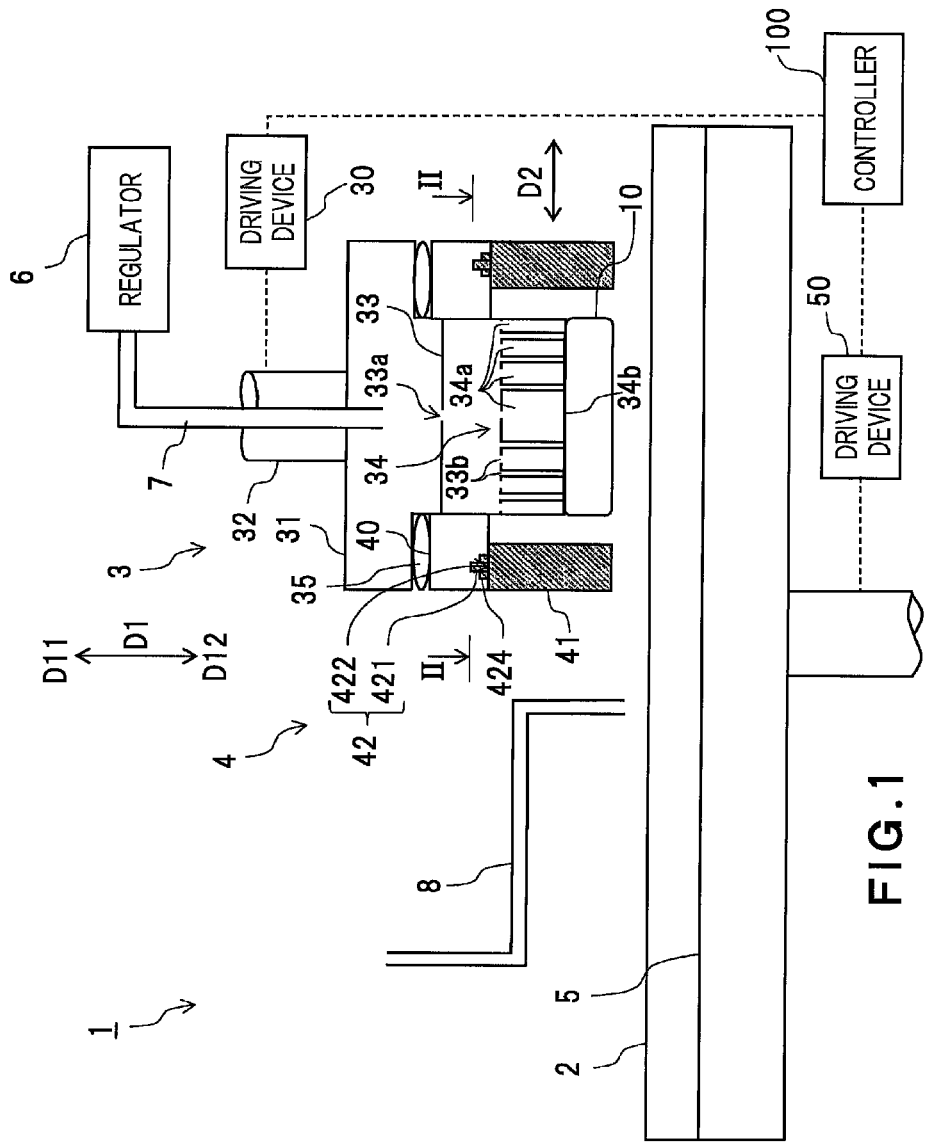
FIG. 1 is a cross-sectional view of a polishing apparatus according to a first embodiment.

An embodiment of a polishing apparatus that changes an inner diameter of a retainer ring according to rotation of a polishing head is described as a first embodiment. FIG. 1 is a cross-sectional view of a polishing apparatus 1 according to the first embodiment. As shown in FIG. 1, the polishing apparatus 1 includes a polishing pad 2 as an example of a first polishing part, a polishing head 3 as an example of a second polishing part, and a retainer ring 4 as an example of an annular part. The polishing apparatus 1 also includes a driving device 30 for the polishing head 3, a polishing table 5, a driving device 50 for the polishing table 5, and a controller 100. The polishing apparatus 1 further includes a regulator 6, an air-line 7, and a polishing-solution supply nozzle 8. The driving device 30 for the polishing head 3 includes a rotating device, such as a motor and a timing belt, for rotating the polishing head 3 and a lifting device, such as a motor, for moving the polishing head 3 up and down. The driving device 50 for the polishing table 5 includes a rotating device, such as a motor and a timing belt, for rotating the polishing table 5. The controller 100 controls operations of respective components of the polishing apparatus 1 that include the driving devices 30 and 50.

(Polishing Pad 2)

The polishing pad 2 is a double-layer pad including a polishing layer arranged on a sub-pad, for example. The polishing pad 2 may be a single-layer pad.

(Polishing Head 3)

The polishing head 3 includes a holder 31, a head shaft 32, a chucking plate 33, a first pressure chamber 34, and a second pressure chamber 35.

The holder 31 is formed to be a flat, hollow, and circular plate being horizontally arranged. The holder 31 is formed of a material that is excellent in strength and rigidity, such as metal or ceramic.

The head shaft 32 is formed to have a cylindrical shape extending from a center portion of the holder 31 to an upward direction D11. The air-line 7 is arranged inside the head shaft 32 and is connected to the regulator 6. The head shaft 32 is connected to the driving device 30 for the polishing head 3. The driving device 30 applies a rotating force to the head shaft 32, so that the head shaft 32 rotates the polishing head 3 around the head shaft 32. Further, the driving device 30 applies a translational force in an axial direction D1 to the head shaft 32, so that the head shaft 32 moves the polishing head 3 up and down. The driving device 30 may apply a translational force in a horizontal direction to the head shaft 32 to enable the polishing head 3 to move to and away from a position immediately above the polishing pad 2 from the horizontal direction.

The chucking plate 33 is arranged at a bottom surface of a center portion of the holder 31. The chucking plate 33 is formed to be a flat, hollow, and circular plate being horizontally arranged. The chucking plate 33 communicates with the air-line 7 through a through hole 33a formed in an upper wall portion thereof. The chucking plate 33 communicates with the first pressure chamber 34 or the outside through a through hole 33b formed in a bottom wall portion thereof. The chucking plate 33 is preferably formed of a material that does not have electrical conductivity or magnetism, such as polyphenylene sulfide (PPS), polyether ether ketone (PEEK), fluorine-based resin, or ceramic, from viewpoints of suppressing metal pollution and ensuring sensitivity of detection of an end point of polishing. The chucking plate 33 may be formed of a metal material. The chucking plate 33 sucks a semiconductor substrate 10 (a wafer) in association with an air intake operation of the regulator 6. The chucking plate 33 supplies air into the first pressure chamber 34 in association with an exhaust operation of the regulator 6.

The first pressure chamber 34 is arranged at a bottom surface of the chucking plate 33. The first pressure chamber 34 is divided into a plurality of (four in FIG. 1) sections 34a in a radial direction D2. Every section 34a communicates with the chucking plate 33. Air is supplied to each section 34a from the regulator 6 via the chucking plate 33, so that each section 34a applies a polishing pressure (a polishing load) to the semiconductor substrate 10. The first pressure chamber 34 is formed by an elastic film in order to apply a uniform polishing pressure to the semiconductor substrate 10. For example, it is preferable that the first pressure chamber 34 is formed of a rubber material that is excellent in strength and durability, such as ethylene propylene rubber (EPDM), polyurethane rubber, or silicone rubber. It is more preferable that the first pressure chamber 34 is formed of a rubber material having durometer hardness of 20 to 60. The first pressure chamber 34 may be configured to allow independent control of the polishing pressure for each section 34a. The independent control of the polishing pressure for each section 34a enables adjustment of a polishing amount in the radial direction D2.

The semiconductor substrate 10 is sucked to a bottom surface of the first pressure chamber 34 by the chucking plate 33. That is, the semiconductor substrate 10 is mounted onto the bottom surface (hereinafter, also "mounting surface 34b") of the first pressure chamber 34.

The second pressure chamber 35 is arranged at a bottom surface of a peripheral portion of the holder 31. The second pressure chamber 35 communicates with the air-line 7 through the holder 31. The second pressure chamber 35 may be formed of the same material as the first pressure chamber 34. Air is supplied from the regulator 6 to the second pressure chamber 35, so that the second pressure chamber 35 applies a pressure to the retainer ring 4.

With the polishing head 3 having the above configuration, it is possible to press the semiconductor substrate 10 mounted on the mounting surface 34b against the polishing pad 2 and rub the semiconductor substrate 10.

(Retainer Ring 4)

The retainer ring 4 includes a support part 40, a plurality of blocks 41 as an example of convex portions, and a first moving part 42.

As shown in FIG. 1, the support part 40 is provided in the polishing head 3. Specifically, the support part 40 is fixed to a bottom surface of the second pressure chamber 35. The support part 40 is formed to have an annular shape to face each block 41 in the upward direction D11 in the direction D1 along a rotation axis of the polishing head 3.

Figure 2:
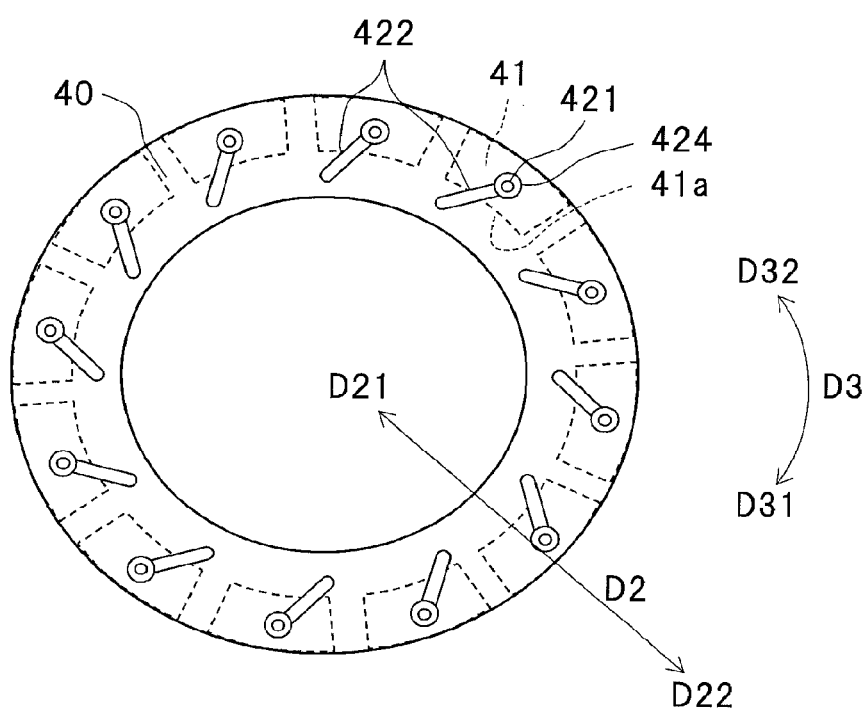
FIG. 2 is a cross-sectional view of the polishing apparatus according to the first embodiment, taken along II-II in FIG. 1.

FIG. 2 is a cross-sectional view of the polishing apparatus according to the first embodiment, taken along II-II in FIG. 1. As shown in FIG. 1, each block 41 projects from the support part 40 toward the polishing pad 2. The blocks 41 are arranged in a circumferential direction D3 around the mounting surface 34b, as shown in FIG. 2. The blocks 41 form a circular arc shape when seen in plan view. Each block 41 has a side surface 41a along an outer circumferential surface of the semiconductor substrate 10, that is, an inner circumferential surface. Each block 41 can be moved in the radial direction D2 by a first moving part 42. Each block 41 can be formed of, for example, a resin material.

The first moving part 42 includes a plurality of slits 422 and a plurality of pins 421.

The slits 422 are provided in a bottom wall of the support part 40 to respectively face the blocks 41 in the upward direction D11 of the blocks 41. As shown in FIG. 2, each slit 422 is inclined to the radial direction toward the same direction D31 (a clockwise direction in FIG. 2) as the rotation direction (hereinafter, also "polishing direction") D31 of the polishing head 3 when the polishing head 3 polishes the semiconductor substrate 10, along with movement in a radially outward direction D22.

The support part 40 is formed to be hollow so as to communicate with the slits 422. Each pin 421 projects from a corresponding block 41 to the upward direction D11 and is inserted to the inside of the support part 40 through the slit 422 facing the corresponding block 41. Each pin 421 is provided with a first stopper 424 that prevents the block 41 from falling inside the support part 40. The first stopper 424 may be formed to be a circular plate having a larger width than that of the slit 422, for example. In the above-described manner, the pins 421 are supported by the support part 40 to be slidable along the slits 422, respectively.

The first moving part 42 moves each block 41 according to rotation of the polishing head 3 while each block 41 is in contact with the polishing pad 2. Specifically, the first moving part 42 moves each block 41 to a radially inward direction D21 when the polishing head 3 rotates in the same direction as the polishing direction D31. The movement of each block 41 in the radially inward direction D21 may be accompanied by movement of each block 41 in the circumferential direction D3. The first moving part 42 moves each block 41 in the radially outward direction D22 when the polishing head 3 rotates in an opposite direction to the polishing direction. The movement of each block 41 in the radially outward direction D22 may be accompanied by the movement of each block 41 in the circumferential direction D3. More specific operation example of the polishing apparatus 1 is described in an embodiment of a semiconductor manufacturing method described later.

According to the polishing apparatus 1 of the first embodiment, each block 41 is moved to the radially inward direction D21 by the first moving part 42, so that the inner diameter of the retainer ring 4 can be reduced. Reducing the inner diameter of the retainer ring 4 can substantially eliminate a gap between the semiconductor substrate 10 and the retainer ring 4. Therefore, rebounding of the polishing pad 2 can be suppressed, and the uniformity of a polishing amount can be improved.

(Semiconductor Manufacturing Method)

Figure 3:
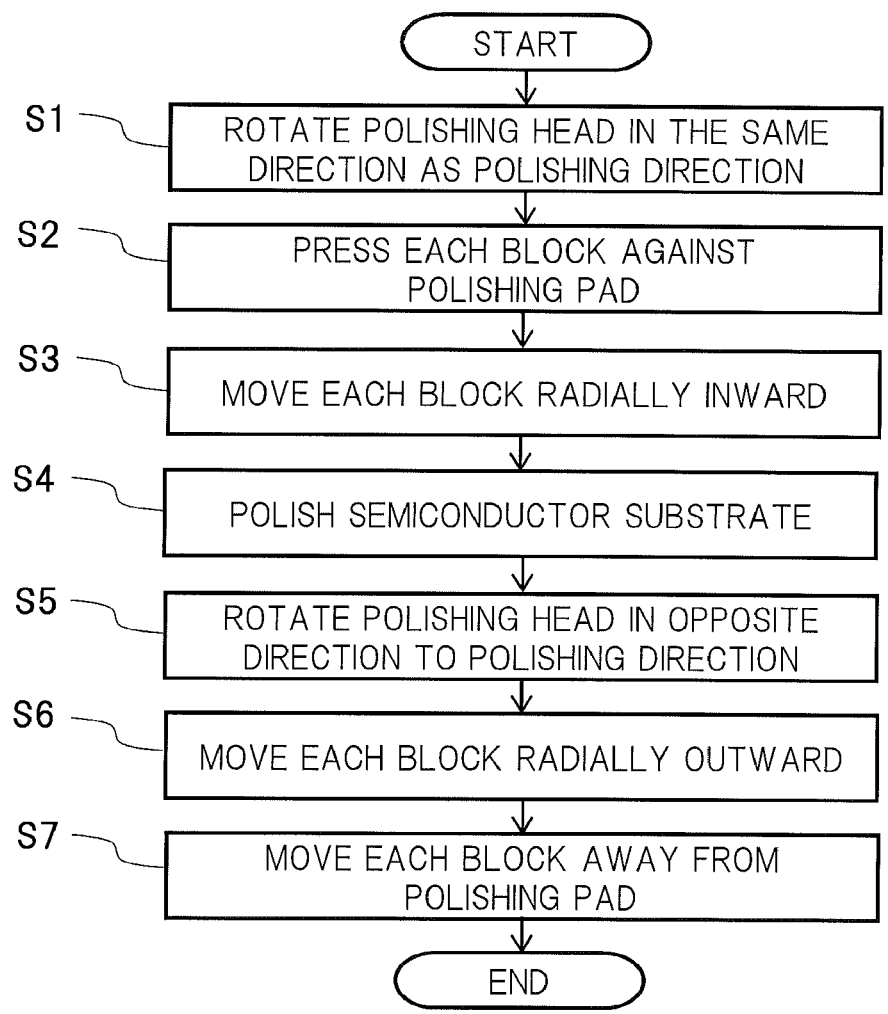
FIG. 3 is a flowchart of a semiconductor manufacturing method according to the first embodiment.

A semiconductor manufacturing method to which the polishing apparatus 1 of FIG. 1 is applied is described. FIG. 3 is a flowchart of a semiconductor manufacturing method according to the first embodiment. Specifically, FIG. 3 is a flowchart of a CMP process. In an initial stage of FIG. 3, it is assumed that the polishing head 3 has mounted the semiconductor substrate 10 onto the mounting surface 34b, as shown in FIG. 1. It is also assumed that the polishing head 3 is away from the polishing pad 2 in the upward direction D11 in the initial stage of FIG. 3, as shown in FIG. 1. It is further assumed that each block 41 has been moved to the radially outward direction D22, as shown in FIG. 2, and therefore the inner diameter of the retainer ring 4 has been increased in the initial stage of FIG. 3. In FIG. 2, the pins 421 are located at radially outer ends of the slits 422, respectively.

Figure 4A:
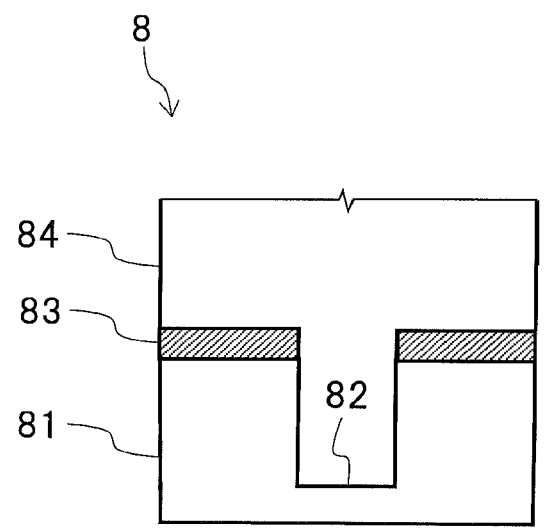
FIG. 4A is a cross-sectional view showing the semiconductor manufacturing method according to the first embodiment.
Figure 4B:
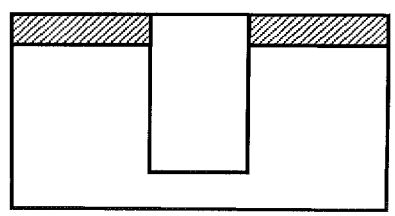
FIG. 4B is a cross-sectional view showing the semiconductor manufacturing method following that shown in FIG. 4A.

FIG. 4A is a cross-sectional view showing the semiconductor manufacturing method according to the first embodiment. FIG. 4B is a cross-sectional view showing the semiconductor manufacturing method according to the first embodiment, following that shown in FIG. 4A. In the first embodiment, the semiconductor substrate 10 of FIG. 4A is processed by a CMP process as an example. The semiconductor substrate 10 of FIG. 4A includes a substrate 81, a groove 82, a first insulation film 83, and a second insulation film 84 in this order. The depth of the groove 82 is 200 nm, for example. The first insulation film 83 is formed of SiN to have a thickness of 15 nm, for example. The second insulation film 84 is formed of NSG (Non-doped Silicate Glass) to have a thickness of 350 nm, for example. The depth of the groove 82 and the thicknesses of the insulation films 83 and 84 are not limited to the above. Also, the materials of the insulation films 83 and 84 are not limited to the above. For example, at least one kind of insulating material selected from a group of TEOS (tetraethoxysilane), SiN, SiCH, SiCN, SiOC, SiOCH, and p-Si may be used. In the first embodiment, the second insulation film 84 on the semiconductor substrate 10 of FIG. 4A, which is unnecessary, is removed by CMP, so that the semiconductor substrate 10 of FIG. 4B is obtained.

On the above assumptions, the polishing head 3 rotates in the same direction as the polishing direction D31 first (Step S1). At this time, the polishing head 3 rotates together with the head shaft 32 because the driving device 30 applies to a rotating force to the head shaft 32. Also, the semiconductor substrate 10 mounted on the mounting surface 34b and the retainer ring 4 fixed to the polishing head 3 rotate in the same direction D31 as the polishing head 3 in association with the rotation of the polishing head 3. Further, at this time, the polishing table 5 is rotated by the driving device 50 in the same direction D31 as the polishing head 3.

FIG. 5A is a cross-sectional view showing the semiconductor manufacturing method according to the first embodiment. Subsequently, the polishing head 3 presses each block 41 of the retainer ring 4 against the polishing pad 2 while rotating in the same direction as the polishing direction D31, as shown in FIG. 5A (Step S2). At this time, the polishing head 3 moves down together with the head shaft 32 because the driving device 30 applies a translational force in the downward direction D12 to the head shaft 32.

Each block 41 is subjected to a friction force in an opposite direction D32 to the polishing direction D31 that is applied by the polishing pad 2, by coming into contact with the polishing pad 2 having friction resistance while rotating in the same direction as the polishing direction D31. At this time, the slit 422 extends toward a resultant direction of composition of the direction D32 in which the friction force acts and the radially inward direction D21 by regarding a position of the pin 421 provided in the block 41 as a reference. Therefore, each block 41 causes the pin 421 to slide along the slit 422, thereby moving to the radially inward direction D21 while making a relative movement in the opposite direction D32 with respect to the polishing head 3 (Step S3).

Figure 6:
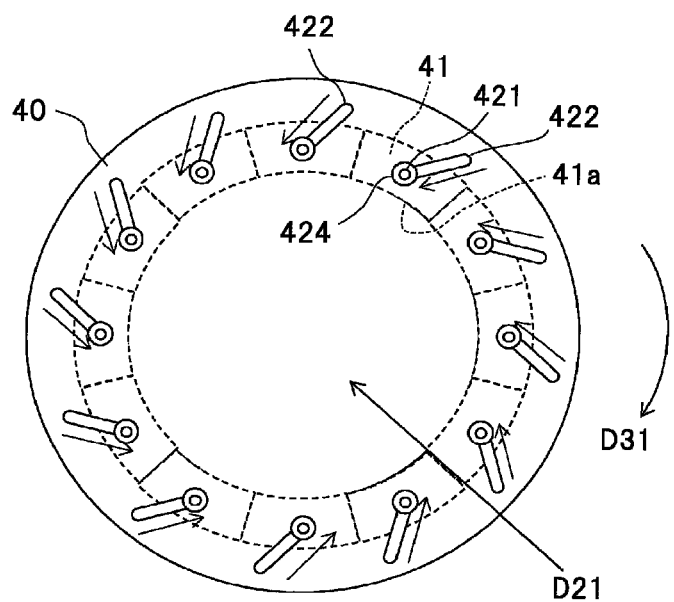
FIG. 6 is a cross-sectional view showing the semiconductor manufacturing method according to the first embodiment, taken along VI-VI in FIG. 5B.

FIG. 5B is a cross-sectional view showing the semiconductor manufacturing method, following that shown in FIG. 5A. FIG. 6 is a cross-sectional view showing the semiconductor manufacturing method according to the first embodiment, taken along VI-VI in FIG. 5A. As shown in FIGS. 5B and 6, each block 41 that has moved to the radially inward direction D21 stops moving when the pin 421 comes into contact with a radially inner end of the slit 422. In this manner, the inner diameter of the retainer ring 4 is reduced.

Subsequently, while pressing the retainer ring 4 against the polishing pad 2 with the polishing head 3, the polishing head is rotated in the polishing direction D31 to polish the semiconductor substrate 10, as shown in FIG. 3 (Step S4). At this time, the polishing-solution supply nozzle 8 supplies a slurry onto the polishing pad 2. The slurry contains ceria as abrasives. For example, the slurry contains 1 wt % ceria that has a particle diameter of 100 nm and is adjusted to pH 9. The polishing-solution supply nozzle 8 supplies a slurry onto the polishing pad 2 at a flow rate of 200 ml/min, for example. The regulator 6 supplies air to the first pressure chamber 34 and the second pressure chamber 35 to apply a pressure to the semiconductor substrate 10 and the retainer ring 4.

An example of other polishing conditions is as follows.
Polishing load: 400 gf/cm$^2$
Retainer ring load: 400 gf/cm$^2$
Rotation speed of polishing head: 100 rpm
Rotation speed of polishing table: 105 rpm
Polishing pad: commercially available double-layer pad
Polishing time: removal of the second insulating film is detected with a TCM (a current value of the polishing table)

For example, after polishing of the semiconductor substrate 10 under the above polishing conditions is finished, the polishing head 3 is rotated in the opposite direction D32 to the polishing direction D31 by a power from the driving device 30 (Step S5).

While the polishing head 3 is rotated in the opposite direction D32, each block 41 is in contact with the polishing pad 2. Therefore, a friction force in the polishing direction D31 by the polishing pad 2 acts on each block 41. At this time, the slit 422 extends to a resultant direction of composition of the direction D31 in which the friction force acts and the radially outward direction D22 by regarding the position of the pin 421 provided in the block 41 as a reference. Therefore, each block 41 causes the pin 421 to slide along the slit 422, thereby moving to the radially outward direction D22 while making a relative movement in the same direction as the polishing direction D31 with respect to the polishing head 3 (Step S6). In this manner, the inner diameter of the retainer ring 4 is increased.

Subsequently, the polishing head 3 moves each block 41 away from the polishing pad 2 to the upward direction D11 (Step S7). At this time, the polishing head 3 moves up together with the head shaft 32 because the driving device 30 applies a translational force in the upward direction D11 to the head shaft 32.

Figure 7A:
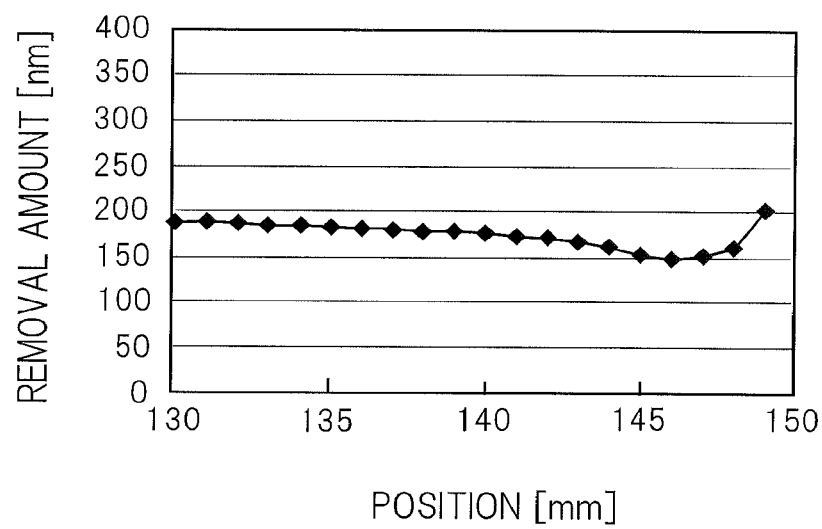
FIG. 7A is a graph of a polishing amount by the semiconductor manufacturing method according to the first embodiment.
Figure 7B:
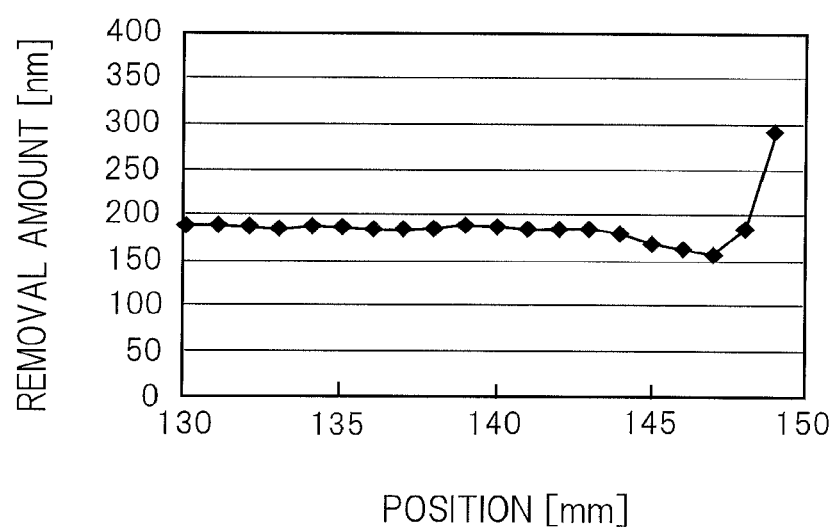
FIG. 7B is a graph of a polishing amount by a semiconductor manufacturing method of a comparative example.

FIG. 7A is a graph of a polishing amount by the semiconductor manufacturing method according to the first embodiment. FIG. 7B is a graph of a polishing amount by a semiconductor manufacturing method of a comparative example. FIG. 7B is a graph in a case where the semiconductor substrate 10 is polished with a polishing apparatus including a retainer ring having a constant inner diameter. In FIGS. 7A and 7B, the horizontal axis represents a position, that is, a distance from the center of the semiconductor substrate 10, and the vertical axis represents a removal amount, that is, a polishing amount. FIGS. 7A and 7B show profiles of a polishing amount in an outer peripheral area having a width of 20 mm of the semiconductor substrate 10 having a radius of 150 mm.

In a case where the inner diameter of the retainer ring cannot be changed, polishing proceeds in a state where the semiconductor substrate 10 is shifted toward the downstream side in the rotation direction of the polishing pad because of a gap between the retainer ring and the semiconductor substrate 10. Therefore, variation in the polishing amount is large. For example, the polishing amount around an outer end (that is, a position 150 mm away from the center) is about 1.5 times that at a position 140 mm away from the center, as shown in FIG. 7B.

On the other hand, in the semiconductor manufacturing method according to the first embodiment, the inner diameter of the retainer ring 4 is reduced, so that the gap between the retainer ring 4 and the semiconductor substrate 10 can be substantially eliminated. Therefore, it is possible to prevent polishing from proceeding while the semiconductor substrate 10 is shifted toward the downstream side in the rotation direction of the polishing pad. This enables the polishing amount to be uniform. For example, the polishing amount around the outer end (the position 150 mm away from the center) can be suppressed to about 1.14 times that at the position 140 mm away from the center, as shown in FIG. 7A.

As described above, the first embodiment can improve the uniformity of a polishing amount. For example, it is possible to perform uniform polishing to the outer edge of the semiconductor substrate 10 including an imperfect shot portion that is not used for a product, and therefore separation of an insulation film of the semiconductor substrate 10 caused by overpolishing at the outer edge can be suppressed. Because the separation of the insulation film can be suppressed, it is possible to avoid dissolving of a metal of the semiconductor substrate 10 caused by a chemical liquid entering the inside of the semiconductor substrate 10 from a portion of the semiconductor substrate 10 in which the insulation film is separated, in a wet process following CMP. Consequently, a yield of a semiconductor device obtained from the semiconductor substrate 10 can be improved. Further, according to the first embodiment, the inner diameter of the retainer ring 4 can be reduced and increased by using the existing power sources 30 and 50.

(First Modification)

Figure 8:
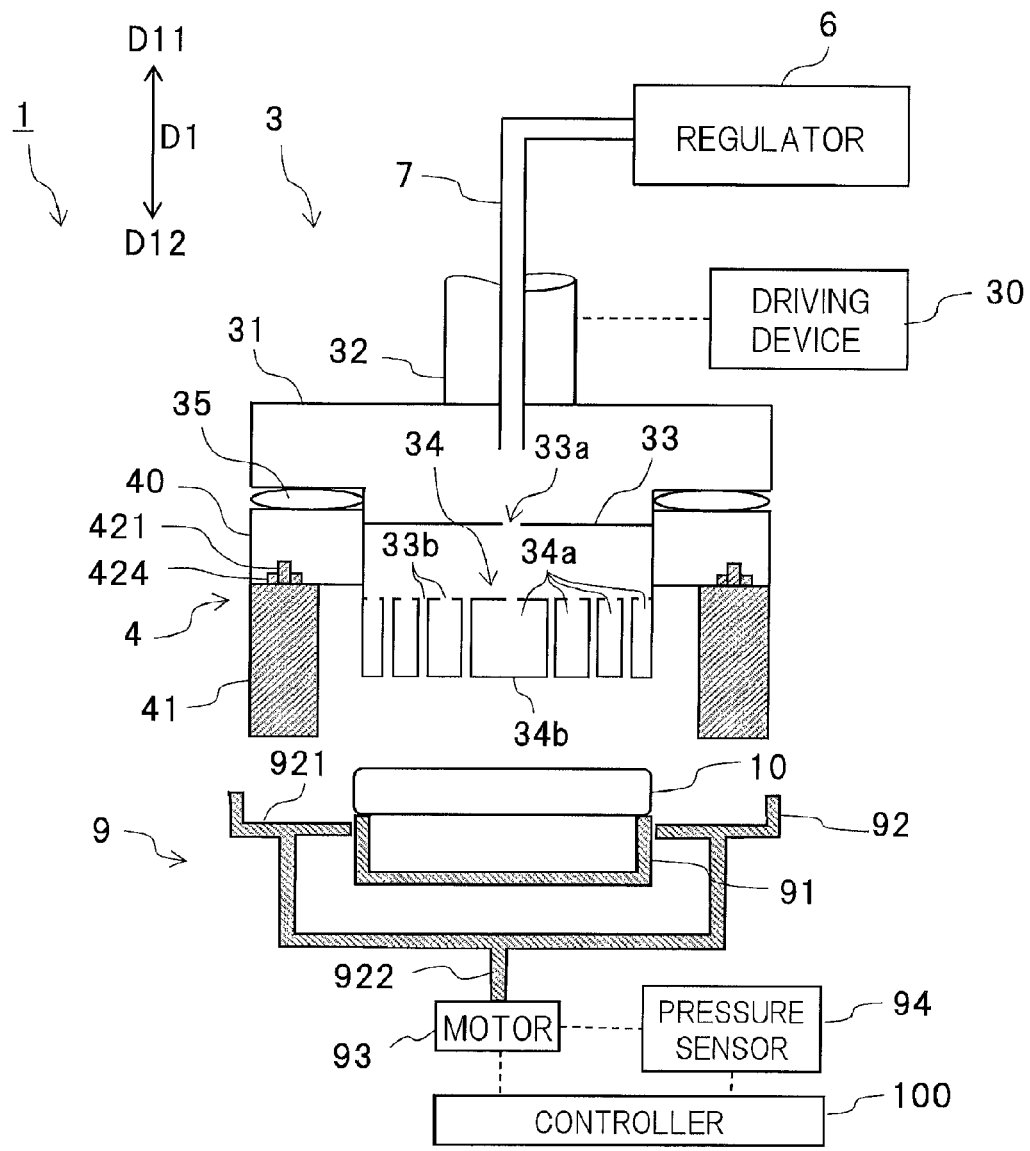
FIG. 8 is a cross-sectional view of a polishing apparatus according to a first modification of the first embodiment.

An example of a polishing apparatus that changes an inner diameter of a retainer ring according to rotation of a guide part of an attaching/detaching part is described as a first modification of the first embodiment. In the first modification, constituent elements corresponding to those of FIG. 1 are denoted by like reference numerals and redundant explanations thereof will be omitted. FIG. 8 is a cross-sectional view of the polishing apparatus 1 according to the first modification of the first embodiment.

As shown in FIG. 8, the polishing apparatus 1 according to the first modification includes an attaching/detaching part 9 in addition to the configuration shown in FIG. 1. As shown in FIG. 8, the attaching/detaching part 9 includes an attaching/detaching portion 91, a guide part 92, a motor 93, and a pressure sensor 94. In FIG. 8, the polishing pad 2 and the polishing table 5 are not shown.

The semiconductor substrate 10 is mounted via its outer edge on the attaching/detaching portion 91, as shown in FIG. 8. The attaching/detaching portion 91 supports the semiconductor substrate 10 horizontally before the semiconductor substrate 10 is mounted on the polishing head 3 or after the semiconductor substrate 10 removed therefrom.

The guide part 92 has a horizontal guide surface 921 arranged at an outer circumference of the attaching/detaching portion 91. The guide surface 921 has a predetermined friction resistance. When the semiconductor substrate 10 is attached to and detached from the polishing head 3, each block 41 comes into contact with the guide surface 921 from above. The contact of each block 41 with the guide surface 921 enables the guide part 92 to guide attachment and detachment of the semiconductor substrate 10 to/from the polishing head 3. Further, the guide part 92 is rotatable around a rotation shaft 922 in the center.

The motor 93 rotates the guide part 92 in the same direction or the opposite direction as/to the polishing direction D31.

The first moving part 42 moves each block 41 to the radially inward direction D21 when the guide part 92 rotates in the opposite direction D32 to the polishing direction D31. The first moving part 42 moves each block 41 to the radially outward direction D22 when the guide part 92 rotates in the same direction as the polishing direction D31.

The pressure sensor 94 detects a load applied to the motor 93. The controller 100 detects contact of each block 41 with an outer circumferential surface of the semiconductor substrate 10 based on a detection value of the load by the pressure sensor 94. The controller 100 executes control of stopping the motor 93 in a case where the contact of each block 41 with the outer circumferential surface of the semiconductor substrate 10 is detected.

Figure 9:
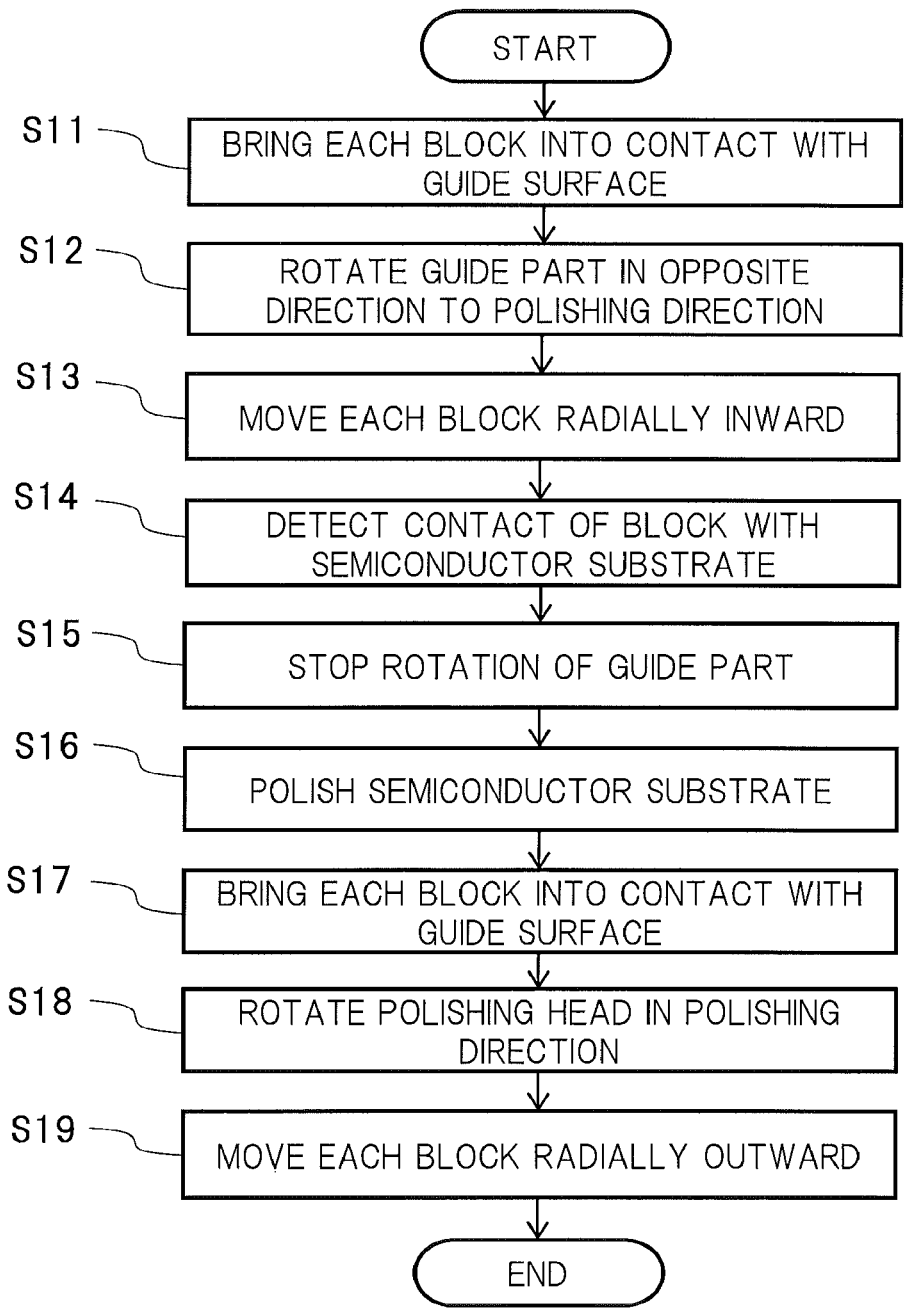
FIG. 9 is a flowchart of a semiconductor manufacturing method according to the first modification of the first embodiment.

Next, a semiconductor manufacturing method to which the polishing apparatus 1 of FIG. 8 is applied is described. FIG. 9 is a flowchart of a semiconductor manufacturing method according to the first modification of the first embodiment. In an initial stage of FIG. 9, it is assumed that the semiconductor substrate 10 is mounted on the attaching/detaching portion 91 as shown in FIG. 8. It is also assumed that the polishing head 3 is away from the attaching/detaching part 9 to the upward direction D11 as shown in FIG. 8 in the initial stage of FIG. 9. It is further assumed that each block 41 has been moved to the radially outward direction D22, and the inner diameter of the retainer ring 4 has been increased in the initial stage of FIG. 9.

FIG. 10A is a cross-sectional view showing the semiconductor manufacturing method according to the first modification of the first embodiment. As shown in FIG. 10A, first, the polishing head 3 moves down with a power of the driving device 30 to bring the first pressure chamber 34 into contact with the semiconductor substrate 10 and bring each block 41 into contact with the guide surface 921 (Step S11 in FIG. 9). At this time, the regulator 6 performs an air intake operation to suck the semiconductor substrate 10 onto the mounting surface 34b of the first pressure chamber 34.

The guide part 92 is then rotated by the motor 93 in the opposite direction D32 to the polishing direction D31 (Step S12). In association with the rotation of the guide part 92, a friction force to the rotation direction D32 of the guide part 92 acts on each block 41 that is in contact with the guide surface 921, from the guide surface 921.

At this time, the slit 422 extends toward a resultant direction of composition of the direction D32 in which the friction force acts and the radially inward direction D21 by regarding a position of the pin 421 provided in the block 41 as a reference. Therefore, each block 41 causes the pin 421 to slide along the slit 422, thereby moving to the radially inward direction D21 while being accompanied by movement in the rotation direction D32 of the guide part 92 (Step S13).

FIG. 10B is a cross-sectional view showing the semiconductor manufacturing method, following that shown in FIG. 10A. As shown in FIG. 10B, each block 41 that has been moved to the radially inward direction D21 comes into contact with an outer circumferential surface of the semiconductor substrate 10. The controller 100 detects the contact of each block 41 with the outer circumferential surface of the semiconductor substrate 10 based on a detection value of the pressure sensor 94 being equal to or larger than a threshold value (Step S14).

Upon detecting the contact of each block 41 with the outer circumferential surface of the semiconductor substrate 10, the controller 100 stops the rotation of the guide part 92 (Step S15). In this manner, the inner diameter of the retainer ring 4 is reduced.

Subsequently, the polishing head 3 transfers the semiconductor substrate 10 from the attaching/detaching part 9 to the polishing pad 2 with a power of the driving device 30, and polishes the semiconductor substrate 10 with the polishing pad 2 (Step S16). The conditions of polishing can be identical to those in a case of FIG. 3.

After polishing of the semiconductor substrate 10 is finished, the polishing head 3 transfers the semiconductor substrate 10 from the polishing pad 2 to the attaching/detaching part 9 with the power of the driving device 30 and brings each block 41 into contact with the guide surface 921 similarly to FIG. 10B (Step S17). At this time, the regulator 6 performs an exhaust operation to stop sucking the semiconductor substrate 10 and to allow the semiconductor substrate 10 to be placed on the attaching/detaching portion 91.

The guide part 92 is then rotated by the motor 93 in the polishing direction D31 (Step S18). In association with the rotation of the guide part 92, a friction force in the rotation direction D31 of the guide part 92 acts on each block 41 that is in contact with the guide surface 921, from the guide surface 921.

At this time, the slit 422 extends to a resultant direction of composition of the direction D31 in which the friction force acts and the radially outward direction D22 by regarding the position of the pin 421 provided in the block 41 as a reference. Therefore, each block 41 causes the pin 421 to slide along the slit 422, thereby moving to the radially outward direction D22 while being accompanied by movement to the rotation direction D31 of the guide part 92 (Step S19). In this manner, the inner diameter of the retainer ring 4 is increased.

As described above, according to the first modification, it is possible to improve the uniformity of a polishing amount similarly to the configuration of FIG. 1 and the method of FIG. 3. Further, the inner diameter of the retainer ring 4 can be reduced or increased when the semiconductor substrate 10 is attached to or detached from the polishing head 3. Therefore, work efficiency of CMP can be improved.

(Second Modification)

Figure 11A:
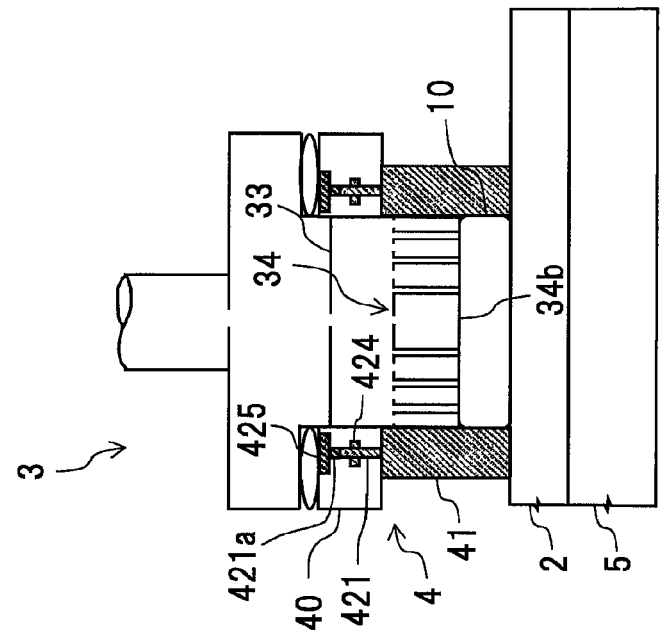
FIG. 11A is a cross-sectional view of a polishing apparatus according to a second modification of the first embodiment, in a state where a polishing pad is away from a polishing head.
Figure 11B:
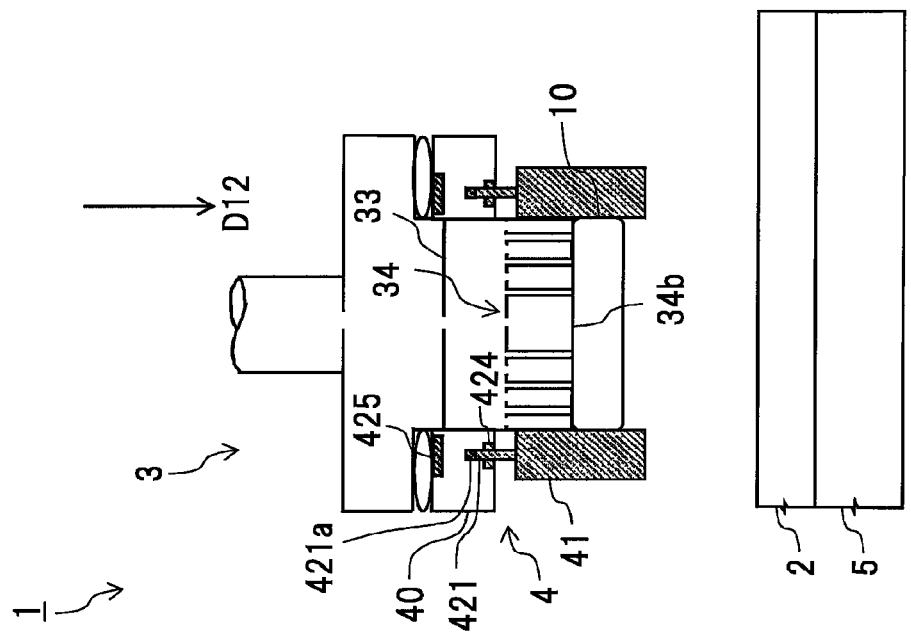
FIG. 11B is a cross-sectional view of the polishing apparatus in a state where the polishing head is pressed against the polishing pad.

An example of a polishing apparatus that stabilizes pressing of a retainer ring against a polishing pad is described as a second modification of the first embodiment. In the second modification, constituent elements corresponding to those of FIG. 1 are denoted by like reference numerals and redundant explanations thereof will be omitted. FIG. 11A is a cross-sectional view of the polishing apparatus 1 according to the second modification of the first embodiment, in a state where the polishing pad 2 is away from the polishing head 3. FIG. 11B is a cross-sectional view of the polishing apparatus 1 in a state where the polishing head 3 is pressed against the polishing pad 2.

In the configuration of FIG. 1, a gap between the block 41 and the first stopper 424 is substantially equal to the thickness of the bottom wall of the support part 40 sandwiched between the block 41 and the first stopper 424. Therefore, a positional relationship of each block 41 and the support part 40 in the axial direction D1 is constant in the configuration of FIG. 1. That is, each block 41 does not move up and down relative to the support part 40.

Meanwhile, in the second modification, the gap between the block 41 and the first stopper 424 is larger than the thickness of the bottom wall of the support part 40 sandwiched between the block 41 and the first stopper 424, as shown in FIGS. 11A and 11B. Therefore, each block 41 moves up and down relative to the support part 40 in the second modification.

Further, the support part 40 includes a second stopper 425 in the second modification, as shown in FIGS. 11A and 11B. The second stopper 425 faces a top end portion 421a of the pin 421 inside the support part 40. More specifically, the second stopper 425 is formed to be a flat plate and is horizontally provided on an inner bottom surface of an upper wall portion of the support part 40. When the top end portion 421a of the pin 421 comes into contact with the second stopper 425, the second stopper 425 regulates upward movement of the block 41.

Furthermore, the top end portion 421a of the pin 421 and the second stopper 425 are elastic in the second modification. The top end portion 421a and the second stopper 425 may be formed of a rubber material, for example.

Next, a semiconductor manufacturing method according to the second modification is described.

After the semiconductor substrate 10 is sucked to the attaching/detaching part 9 and the inner diameter of the retainer ring 4 is reduced similarly to FIG. 10B, the polishing head 3 transfers the semiconductor substrate 10 to a position immediately above the polishing head 3 for performing polishing as shown in FIG. 11A. In a case where the polishing head 3 is away from the polishing pad 2 as shown in FIG. 11A, each block 41 is away from the support part 40 in the downward direction D12 due to its gravity. At this time, the pin 421 is pulled out to the downward direction D12 due to the gravity of each block 41. However, falling of the pin 421 and the block 41 can be prevented by contact of the first stopper 424 with an edge portion of the slit 422 inside the support part 40.

Subsequently, the polishing head 3 presses the polishing pad 2, as shown in FIG. 11B. When the polishing head 3 is pressed against the polishing pad 2 as shown in FIG. 11B, each block 41 moves up relative to the support part 40 while pressing the pin 421 to the inside of the support part 40 with a normal force from the polishing pad 2. When the top end portion 421a of the pin 421 comes into contact with the second stopper 425, the upward movement of the block 41 is regulated. The top end portion 421a and the second stopper 425 are in stable contact with each other with an elastic force. Therefore, the polishing head 3 can polish the semiconductor substrate 10 while fixing the position of the block 41 and stably pressing the retainer ring 4 against the semiconductor substrate 10.

As described above, it is possible to stably press the retainer ring 4 in the second modification. Therefore, the uniformity of a polishing amount can be further improved.

Second Embodiment

Figure 12:
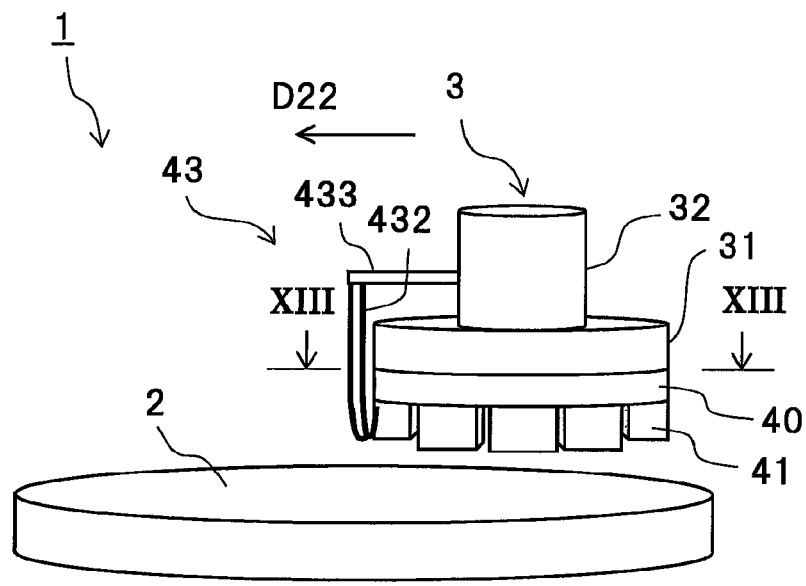
FIG. 12 is a perspective view of a polishing apparatus according to a second embodiment.
Figure 13:
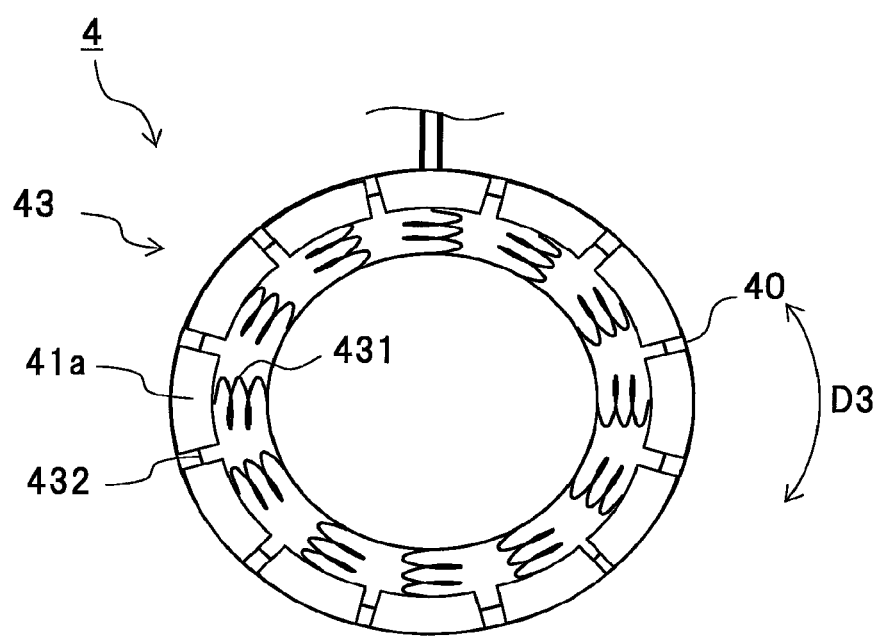
FIG. 13 is a cross-sectional view showing the polishing apparatus according to the second embodiment, taken along XIII-XIII in FIG. 12.
Figure 14:
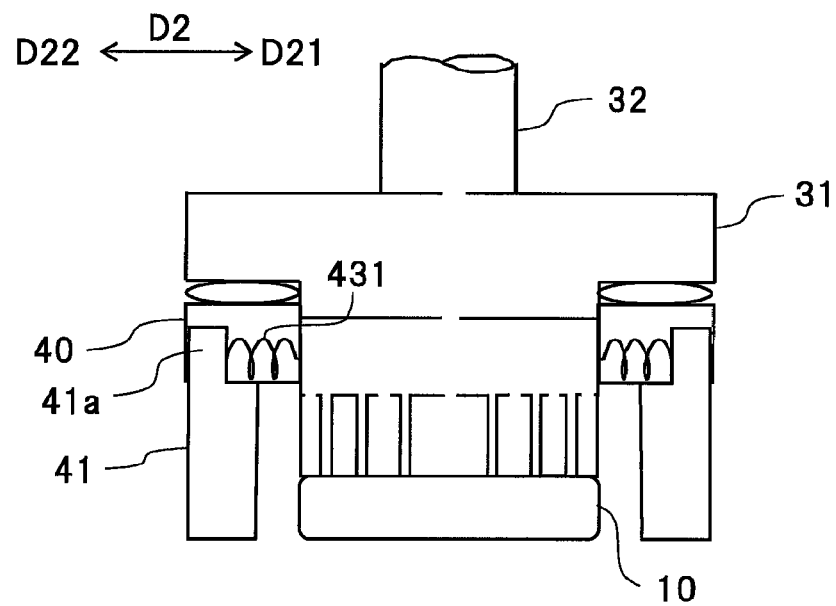
FIG. 14 is a cross-sectional view of the polishing apparatus according to the second embodiment.

An embodiment of a polishing apparatus in which an inner diameter of a retainer ring is reduced according to pressing of a polishing head against a polishing pad is described as a second embodiment. In the second embodiment, constituent elements corresponding to those of the first embodiment are denoted by like reference numerals and redundant explanations thereof will be omitted. FIG. 12 is a perspective view of the polishing apparatus 1 according to the second embodiment. FIG. 13 is a cross-sectional view showing the polishing apparatus 1 according to the second embodiment, taken along XIII-XIII in FIG. 12. FIG. 14 is a cross-sectional view of the polishing apparatus according to the second embodiment.

As shown in FIGS. 12 to 14, the polishing apparatus 1 according to the second embodiment includes a second moving part 43 in place of the first moving part 42. The second moving part 43 includes compression springs 431 as an example of a pressing member and a wire 432. The number of the compression springs 431 is the same as that of the blocks 41.

As shown in FIG. 14, a top end portion 41a of each block 41 is inserted to the inside of the support part 40 from below. An end portion on the side of the radially outward direction D22 of each compression spring 431 is a free end that is not fixed to the support part 40. The top end portion 41a of each block 41 is connected to this free end. Meanwhile, an end portion on the side of the radially inward direction D21 of each compression spring 431 is a fixed end fixed to the inner wall of the support part 40. With this configuration, the compression springs 431 press each block 41 to the radially outward direction D22.

As shown in FIG. 13, the wire 432 extends through each block 41 annularly along the circumferential direction D3. Both ends of the wire 432 are drawn to the outside from one of the blocks 41. The both ends of the wire 432 drawn out from the block 41 are fixed to a fixing part 433 extending from the head shaft 32 to the radially outward direction D22, as shown in FIG. 12.

Figure 15:
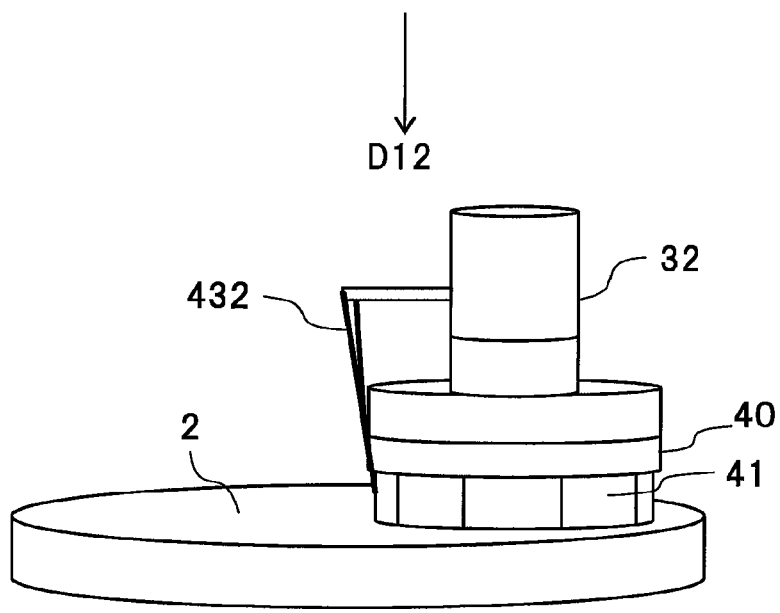
FIG. 15 is a perspective view of a semiconductor manufacturing method according to the second embodiment.
Figure 16:
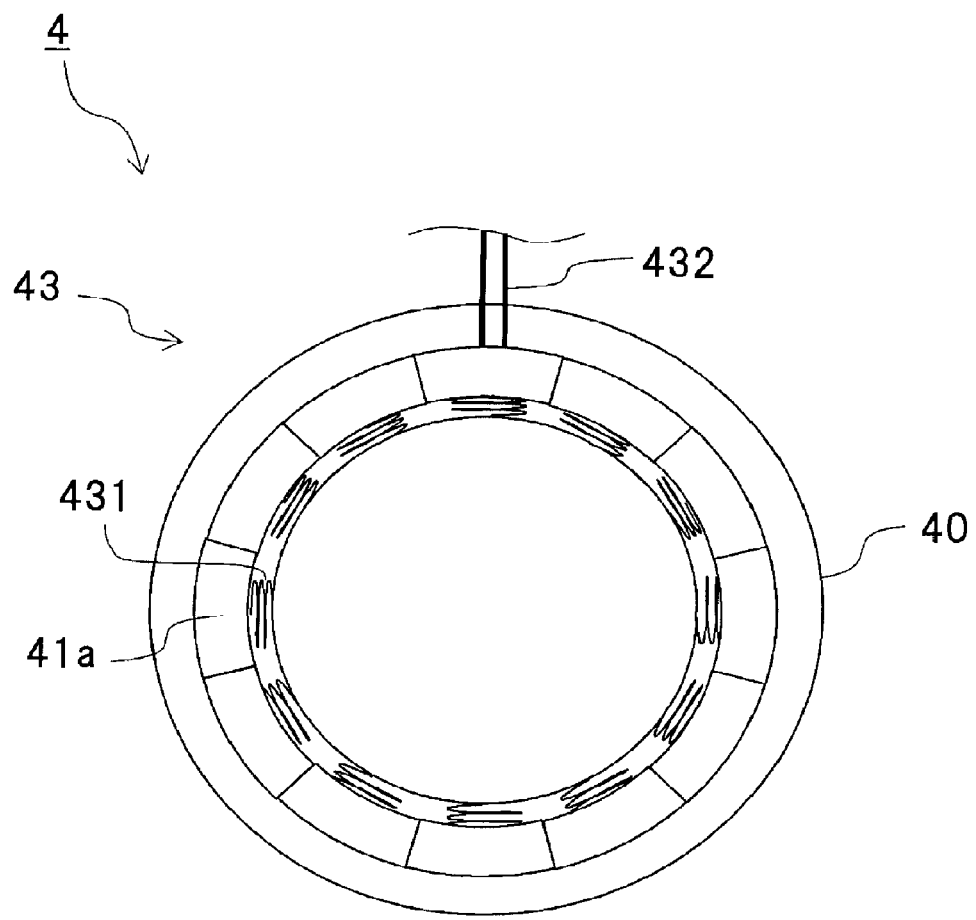
FIG. 16 is a cross-sectional view showing the semiconductor manufacturing method according to the second embodiment.

Next, a semiconductor manufacturing method according to the second embodiment is described. FIG. 15 is a perspective view of the semiconductor manufacturing method according to the second embodiment. FIG. 16 is a cross-sectional view showing the semiconductor manufacturing method according to the second embodiment.

After the semiconductor substrate 10 is sucked to the attaching/detaching part 9 (see FIG. 8), the polishing head 3 transfers the semiconductor substrate 10 to a position immediately above the polishing head 3 for performing polishing, as shown in FIG. 12. In a case where the polishing head 3 is away from the polishing pad 2 as shown in FIG. 12, the wire 432 is loose. Because the wire 432 is loose, a fastening force of the wire does not act on each block 41. Meanwhile, the compression springs 431 press each block 41 to the radially outward direction D22. Therefore, each block 41 is away from the outer circumferential surface of the semiconductor substrate 10 to the radially outward direction D22. That is, the inner diameter of the retainer ring 4 is increased.

Subsequently, the polishing head 3 presses the polishing pad 2, as shown in FIG. 15. At this time, the head shaft 32 extends so that the wire 432 is drawn. When the wire 432 is drawn, each block 41 is fastened by the wire 432. Because each block 41 is fastened by the wire 432, each block 41 is moved to the radially inward direction D21 against the pressing force of the compression spring 431. In this manner, the inner diameter of the retainer ring 4 is reduced, as shown in FIG. 16.

As described above, the second moving part 43 moves each block 41 to the radially inward direction D21 when the polishing head 3 is pressed against the polishing pad 2. The second moving part 43 also moves each block 41 to the radially outward direction D22 when the polishing head 3 moves away from the polishing pad 2.

According to the second embodiment, the inner diameter of the retainer ring 4 can be reduced by the second moving part 43. Therefore, the uniformity of a polishing amount can be improved similarly to the first embodiment.

Third Embodiment

Figure 17:
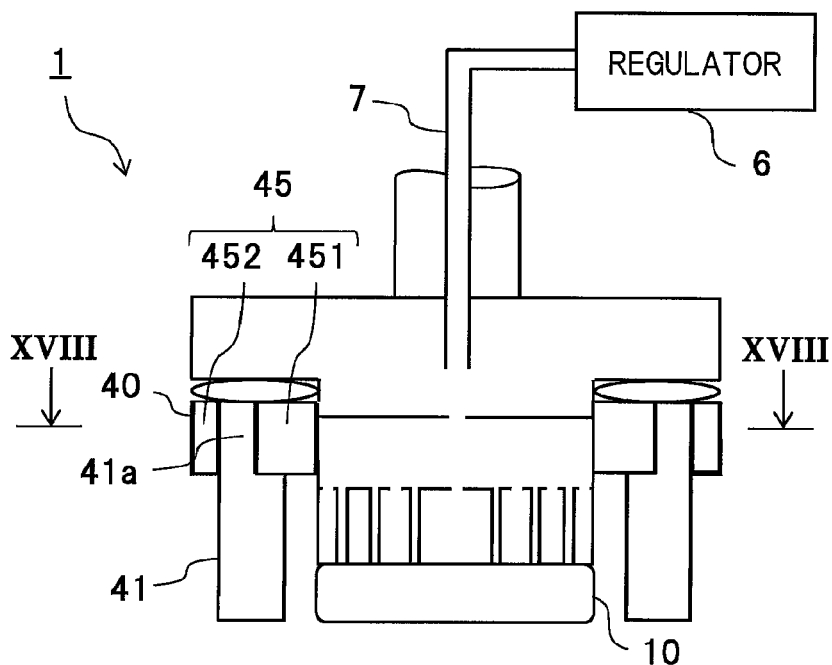
FIG. 17 is a cross-sectional view of a polishing apparatus according to a third embodiment.
Figure 18:
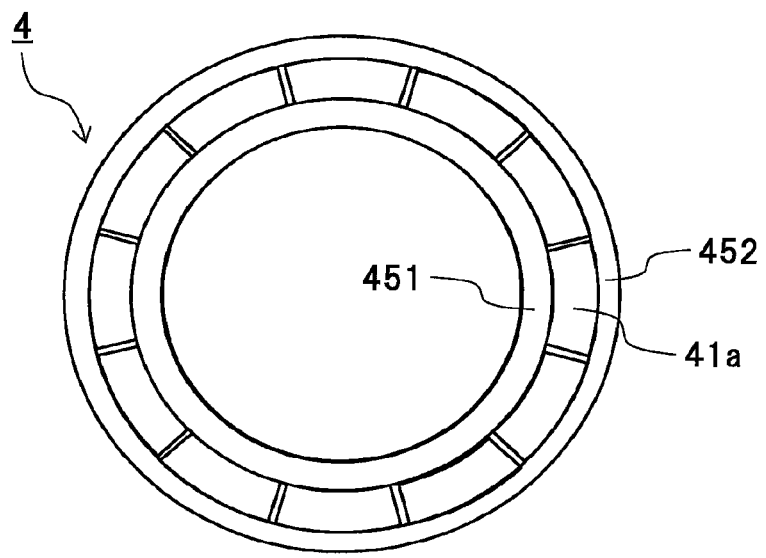
FIG. 18 is a cross-sectional view showing the polishing apparatus according to the third embodiment, taken along XVIII-XVIII in FIG. 17.

An embodiment of a polishing apparatus that changes an inner diameter of a retainer ring according to supply of air is described as a third embodiment. In the third embodiment, constituent elements corresponding to those of the first embodiment are denoted by like reference numerals and redundant explanations thereof will be omitted. FIG. 17 is a cross-sectional view of a polishing apparatus according to the third embodiment. FIG. 18 is a cross-sectional view showing the polishing apparatus according to the third embodiment, taken along XVIII-XVIII in FIG. 17.

As shown in FIGS. 17 and 18, the polishing apparatus 1 according to the third embodiment includes a third moving part 45 in place of the first moving part 42. The third moving part 45 includes a first airbag 451 and a second airbag 452.

The first airbag 451 is formed to have an annular shape concentric with the support part 40. The first airbag 451 is in contact with inner surfaces of the top end portions 41a of the blocks 41 inside the support part 40. The inside of the first airbag 451 communicates with the air-line 7. The first airbag 451 may be joined to the top end portions 41a of the blocks 41.

The second airbag 452 is formed to have an annular shape concentric with the support part 40. The second airbag 452 has a larger diameter than the first airbag 451. The second airbag 452 is in contact with outer surfaces of the top end portions 41a of the blocks 41 inside the support part 40. The inside of the second airbag 452 communicates with the air-line 7. The second airbag 452 may be joined to the top end portions 41a of the blocks 41.

Figure 19:
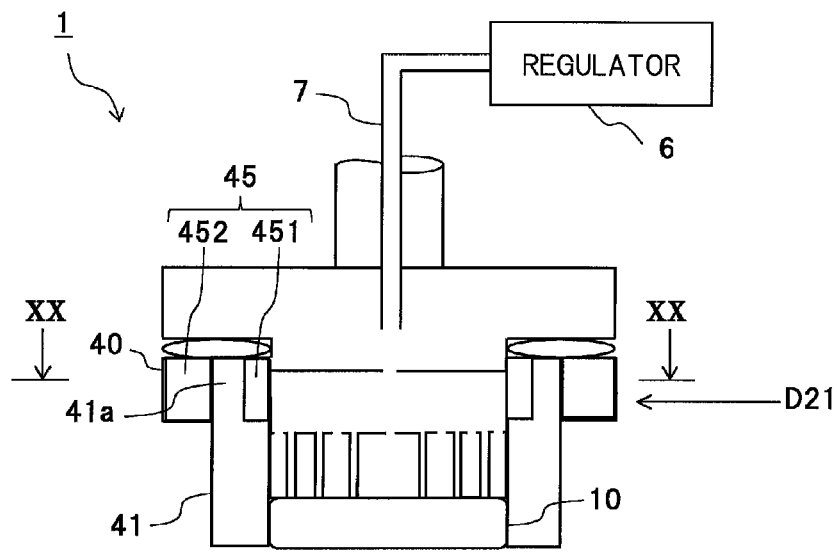
FIG. 19 is a cross-sectional view showing a semiconductor manufacturing method according to the third embodiment.
Figure 20:
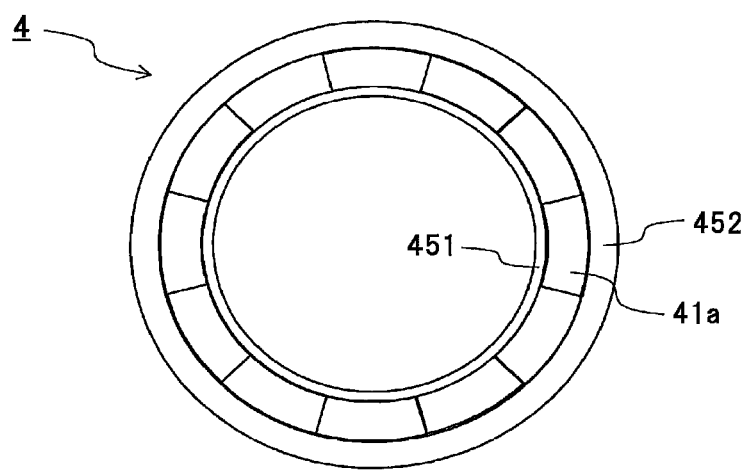
FIG. 20 is a cross-sectional view showing the semiconductor manufacturing method according to the third embodiment, taken along XX-XX in FIG. 17.

Next, a semiconductor manufacturing method according to the third embodiment is described. FIG. 19 is a cross-sectional view showing the semiconductor manufacturing method according to the third embodiment. FIG. 20 is a cross-sectional view showing the semiconductor manufacturing method according to the third embodiment, taken along XX-XX in FIG. 19.

In a case where air is drawn into the first airbag 451 by the regulator 6 but is not drawn into the second airbag 452, the first airbag 451 is inflated and the second airbag 452 is deflated, as shown in FIGS. 17 and 18. Due to the inflation of the first airbag 451, a pressing force to the radially outward direction D22 is caused to act on each block 41 by the first airbag 451, so that each block 41 is moved to the radially outward direction D22. In this manner, the diameter of the retainer ring 4 is increased.

On the other hand, in a case where air is drawn into the second airbag 452 but is not drawn into the first airbag 451, the second airbag 452 is inflated and the first airbag 451 is deflated, as shown in FIGS. 19 and 20. Due to the inflation of the second airbag 452, a pressing force to the radially inward direction D21 is caused to act on each block 41 by the second airbag 452, so that each block 41 is moved to the radially inward direction D21. In this manner, the inner diameter of the retainer ring 4 is reduced.

As described above, the third moving part 45 moves each block 41 in the radial direction according to supply of the air.

According to the third embodiment, because the inner diameter of the retainer ring 4 can be reduced by the third moving part 45, the uniformity of a polishing amount can be improved similarly to the first embodiment.

The first to third embodiments can be appropriately combined with each other.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:
1. A polishing apparatus comprising:
a first polishing part;
a second polishing part comprising a mounting surface for a semiconductor substrate, and rubbing the semiconductor substrate mounted on the mounting surface while pressing the semiconductor substrate against the first polishing part; and
an annular part comprising a support part provided in the second polishing part, and a plurality of convex portions that project from the support part toward the first polishing part, are arranged in a circumferential direction around the mounting surface while being supported by the support part, and are movable in a radial direction of the semiconductor substrate, wherein
the annular part comprises a first moving part moving the convex portions in the radial direction, and
the first moving part changes the location of each of the convex portions in a direction in which an inner diameter of the annular part is reduced or increased in a state where each of the convex portions is in contact with the first polishing part, wherein
the first moving part comprises
a plurality of slits provided in the support part to face the convex portions, respectively, and to be inclined to a radial direction toward a same direction as a rotation direction of the second polishing part when the second polishing part rubs the semiconductor substrate along with movement in a radially outward direction, and
a plurality of pins inserted to an inside of the support part through the slits and supported by the support part to be slidable along the slits, respectively.

2. The apparatus of claim 1, wherein the first moving part moves each of the convex portions in a radially inward direction when the second polishing part rotates in a same direction as when the second polishing part rubs the semiconductor substrate, and moves each of the convex portions in a radially outward direction when the second polishing part rotates in an opposite direction to when the second polishing part rubs the semiconductor substrate.

3. The apparatus of claim 1, wherein the convex portions respectively comprise a side surface along an outer circumferential surface of the semiconductor substrate.

4. The apparatus of claim 1, further comprising:
an attaching/detaching part comprising a guide part guiding attachment and detachment of the semiconductor substrate to/from the second polishing part, and attaching and detaching the semiconductor substrate to/from the second polishing part while the convex portions are in contact with the guide part, wherein
the guide part is rotatable in the circumferential direction, and
the first moving part moves each of the convex portions according to rotation of the guide part in a state where each of the convex portions is in contact with the guide part.

5. The apparatus of claim 4, wherein the first moving part moves each of the convex portions in a radially inward direction when the guide part rotates in an opposite direction to a rotation direction of the second polishing part when the second polishing part rubs the semiconductor substrate, and moves each of the convex portions in a radially outward direction when the guide part rotates in a same direction as the rotation direction of the second polishing part when the second polishing part rubs the semiconductor substrate.

6. The apparatus of claim 5, wherein
the attaching/detaching part comprises a controller controlling rotation of the guide part, and
the controller executes control of stopping rotation of the guide part when the convex portions move in the radially inward direction and come into contact with an outer circumferential surface of the semiconductor substrate.

7. The apparatus of claim 1, wherein each of the pins comprises a first stopper preventing falling of a corresponding one of the convex portions inside the support part, the support part comprises a second stopper facing top end portions of the pins inside the support part and regulating upward movement of the convex portions by contact with the top end portions of the pins, and the top end portions of the pins and the second stopper are elastic.

* * * * *